(12) United States Patent
Ho et al.

(10) Patent No.: US 9,793,234 B2
(45) Date of Patent: Oct. 17, 2017

(54) CHIP PACKAGE AND MANUFACTURING METHOD THEREOF

(71) Applicant: XINTEC INC., Taoyuan (TW)

(72) Inventors: Yen-Shih Ho, Kaohsiung (TW);
Shu-Ming Chang, New Taipei (TW);
Hsing-Lung Shen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/091,122

(22) Filed: Apr. 5, 2016

(65) Prior Publication Data

US 2016/0315061 A1 Oct. 27, 2016

Related U.S. Application Data

(60) Provisional application No. 62/153,408, filed on Apr. 27, 2015.

(51) Int. Cl.
*H01L 23/00* (2006.01)
*H01L 25/16* (2006.01)
(Continued)

(52) U.S. Cl.
CPC .......... *H01L 24/17* (2013.01); *H01L 21/4846* (2013.01); *H01L 23/3121* (2013.01); *H01L 23/49822* (2013.01); *H01L 23/49827* (2013.01); *H01L 24/06* (2013.01); *H01L 24/09* (2013.01); *H01L 24/14* (2013.01); *H01L 25/16* (2013.01); *H01L 23/147* (2013.01); *H01L 23/3192* (2013.01); *H01L 23/49816* (2013.01);
(Continued)

(58) Field of Classification Search
CPC ............... H01L 2924/014; H01L 2224/73265;
H01L 2224/48227; H01L 25/043;
H01L 25/074; H01L 25/0657;
H01L 25/50; H01L 25/117; H01L 25/10
See application file for complete search history.

(56) References Cited

U.S. PATENT DOCUMENTS 6,833,285 B1 * 12/2004 Ahn ................ H01L 23/49894
257/E23.077
7,618,846 B1 * 11/2009 Pagaila ................ H01L 21/568
257/E21.599
(Continued)

FOREIGN PATENT DOCUMENTS

TW 200707683 2/2007
TW 201110308 3/2011
TW 201232735 8/2012

*Primary Examiner* — Marcos D Pizarro
*Assistant Examiner* — Shannon Yi
(74) *Attorney, Agent, or Firm* — Liu & Liu

(57) ABSTRACT

A chip package includes a first chip and a second chip. The first chip includes a first substrate having a first surface and a second surface opposite to the first surface, a first passive element on the first surface, and a first protection layer covering the first passive element, which the first protection layer has a third surface opposite to the first surface. First and second conductive pad structures are disposed in the first protection layer and electrically connected to the first passive element. The second chip is disposed on the third surface, which the second chip includes an active element and a second passive element electrically connected to the active element. The active element is electrically connected to the first conductive pad structure.

18 Claims, 14 Drawing Sheets

(51) Int. Cl.
  *H01L 23/31* (2006.01)
  *H01L 21/48* (2006.01)
  *H01L 23/14* (2006.01)
  *H01L 23/498* (2006.01)

(52) U.S. Cl.
  CPC .............. *H01L 24/03* (2013.01); *H01L 24/05* (2013.01); *H01L 24/13* (2013.01); *H01L 24/16* (2013.01); *H01L 24/81* (2013.01); *H01L 2224/02372* (2013.01); *H01L 2224/0345* (2013.01); *H01L 2224/0346* (2013.01); *H01L 2224/0391* (2013.01); *H01L 2224/0401* (2013.01); *H01L 2224/05548* (2013.01); *H01L 2224/05567* (2013.01); *H01L 2224/0603* (2013.01); *H01L 2224/06182* (2013.01); *H01L 2224/08267* (2013.01); *H01L 2224/08268* (2013.01); *H01L 2224/131* (2013.01); *H01L 2224/13024* (2013.01); *H01L 2224/1403* (2013.01); *H01L 2224/16112* (2013.01); *H01L 2224/16145* (2013.01); *H01L 2224/16267* (2013.01); *H01L 2224/16268* (2013.01); *H01L 2224/81191* (2013.01); *H01L 2224/81192* (2013.01); *H01L 2224/81815* (2013.01); *H01L 2224/81986* (2013.01); *H01L 2924/00014* (2013.01); *H01L 2924/19011* (2013.01); *H01L 2924/19041* (2013.01); *H01L 2924/19042* (2013.01); *H01L 2924/19043* (2013.01)

(56) References Cited

U.S. PATENT DOCUMENTS

| | | | | |
|---|---|---|---|---|
| 7,642,128 B1* | 1/2010 | Lin | ..................... | H01L 21/6835 257/E21.508 |
| 2008/0024998 A1* | 1/2008 | Hsu | ..................... | H01L 23/5389 361/719 |
| 2008/0224249 A1* | 9/2008 | Nabe | ................. | H01L 27/14618 257/433 |
| 2009/0065936 A1* | 3/2009 | Ong | ................... | H01L 23/49816 257/738 |
| 2009/0283602 A1* | 11/2009 | Rogy | ............... | G06K 19/07749 235/492 |
| 2011/0233766 A1* | 9/2011 | Lin | ......................... | H01L 24/11 257/737 |
| 2012/0133381 A1* | 5/2012 | Bruland | ................. | H01L 22/32 324/754.03 |
| 2015/0250054 A1* | 9/2015 | Yoshikawa | .............. | H05K 3/28 361/767 |
| 2016/0064319 A1* | 3/2016 | Suzuki | ............. | H01L 23/49827 174/251 |
| 2016/0240503 A1* | 8/2016 | Shu | ..................... | H01L 23/3142 |

* cited by examiner

```
┌─────────────────────────────────────────────────────────┐
│  Proving a first chip, the first chip including a first │
│  substrate having a first surface and a second surface  │
│  opposite to the first surface, a first passive element │
│  disposed on the first surface, a first protection      │
│  layer disposed on the first surface and covering the   │
│  first passive element, the first protection layer      │──710
│  having a third surface opposite to the first surface,  │
│  a first conductive pad structure and a second          │
│  conductive pad structure disposed in the first         │
│  protection layer and being electrically connected to   │
│  the first passive element, the second conductive pad   │
│  structure surrounding and electrically connected to    │
│  the first conductive pad structure                     │
└─────────────────────────────────────────────────────────┘
                              ↓
┌─────────────────────────────────────────────────────────┐
│  Forming a first opening in the first protection layer  │
│  to expose the first conductive pad structure and       │──720
│  forming a second opening in the first protection       │
│  layer to expose the second conductive pad structure    │
└─────────────────────────────────────────────────────────┘
              ↓   730                    ↓
┌──────────────────────────┐  ┌──────────────────────────┐
│  Forming a first external │  │                          │
│  conductive connection in │  │  Forming a second        │──740
│  the first opening and    │  │  external conductive     │
│  forming a second external│  │  connection in the       │
│  conductive connection in │  │  second opening          │
│  the second opening       │  │                          │
└──────────────────────────┘  └──────────────────────────┘
                              ↓
┌─────────────────────────────────────────────────────────┐
│  Connecting the second chip to the third surface of the │
│  first chip such that the active element being          │──750
│  electrically connected to the first conductive pad     │
│  structure                                              │
└─────────────────────────────────────────────────────────┘
                              ↓
┌─────────────────────────────────────────────────────────┐
│  Cutting the first chip along a first scribe line to    │──760
│  form a chip pacakge                                    │
└─────────────────────────────────────────────────────────┘
```

Fig. 7

CHIP PACKAGE AND MANUFACTURING METHOD THEREOF

RELATED APPLICATIONS

This application claims priority to U.S. Provisional Application Ser. No. 62/153,408, filed Apr. 27, 2015, which is herein incorporated by reference.

BACKGROUND

Field of Invention

The present invention relates to a chip package and a method of manufacturing a chip package.

Description of Related Art

Electronic products require multiple functions, while the dimension has to remain compact. The chip of the electronic products has ever reducing chip size, and the circuit density increases. The manufacturing of chip package is therefore more challenging. Wafer level chip package is one type of chip packaging. It refers to a production process when all the packaging process and testing are done to the entire wafer, and then it is cut into single chip package.

Chip package very often includes integrated active elements and passive element to allow the chip package to work properly. However, to integrate active elements and passive element requires several patterning and material deposition process. These procedures cost high and take long time, and a shrinking chip dimension leads the manufacturing process even more complex and difficult. Therefore, there is an urgent call for a simplified and fast chip packaging technique.

SUMMARY

One aspect of the instant disclosure provides a chip package including a first chip and a second chip. The first chip includes a first substrate having a first surface and a second surface opposite to the first surface, a first passive element disposed on the first surface, a first protection layer covering the first passive element. The first protection layer has a third surface opposite to the first surface. The first chip also includes a first conductive pad structure and a second conductive pad structure disposed in the first protection layer and electrically connected to the first passive element. The second chip is disposed on the third surface. The second chip has an active element and a second passive element electrically connected to the active element. The active element is electrically connected to the first conductive pad structure.

According to some embodiments of the instant disclosure, the first passive element and the second passive element have a shape resembling "U", planar spiral and stereoscopic spiral.

According to some embodiments of the instant disclosure, the second chip includes a second substrate, a second protection layer, a third conductive pad structure, a second insulation layer, a second conductive layer, and a second barrier layer. The active element is disposed underneath the second substrate. The second protection layer is disposed underneath the second substrate and covers the active element. The third conductive pad structure is disposed in the second protection layer and electrically connected to the active element. The second protection layer is formed with a second through hole to expose the third conductive pad structure. The second insulation layer is disposed underneath the second protection layer and extends to the second through hole to cover the wall of the second through hole. The second conductive layer includes a second conductive portion disposed underneath the second insulation layer, and a portion of the second conductive portion is disposed in the second through hole and in contact with the third conductive pad structure. The second passive element is disposed underneath the second insulation layer, and the second passive element and the second conductive portion are electrically connected. The second barrier layer covers the second conductive layer and is formed with a third opening exposing the second conductive portion.

According to some embodiments of the instant disclosure, the first chip includes a first opening formed on the third surface of the first protection layer and exposing the first conductive pad structure and a second opening formed on the third surface of the first protection layer and exposing the second conductive pad structure.

According to some embodiments of the instant disclosure, a first external conductive connection is disposed in between the first conductive pad structure and the third conductive pad structure. A portion of the first external conductive connection is disposed in the first opening, and a portion of the first external conductive connection is disposed in the third opening. A second external conductive connection is disposed in the second opening and in contact with the second conductive pad structure. The dimension of the second external conductive connection is larger than the first external conductive connection.

According to some embodiments of the instant disclosure, the first chip further includes a first opening formed on the third surface of the first protection layer and exposing the first conductive pad structure and a first through hole extending from the second surface towards the third surface and exposing the second conductive pad structure.

According to some embodiments of the instant disclosure, the first chip further includes a first insulating layer, a first conductive layer and a first barrier layer. The first insulating layer is disposed underneath the second surface and extending to the first through hole and covering the wall of the first through hole. The first conductive layer includes a first conductive portion disposed underneath the first insulation layer, and a portion of the first conductive portion is disposed in the first through hole and in contact with the second conductive pad structure. The first conductive layer also includes a third passive element disposed underneath the first insulation layer, and a portion of the third passive element is connected to the first conductive portion. The first barrier layer covers the first conductive layer, and the first barrier layer formed with a second opening exposing the first conductive portion.

According to some embodiments of the instant disclosure, the third passive element has a shape resembling "U", planar spiral and stereoscopic spiral.

According to some embodiments of the instant disclosure, a first external conductive connection is disposed in between the first conductive pad structure and the third conductive pad structure. A portion of the first external conductive connection is disposed in the first opening, and a portion of the first external conductive connection is disposed in the third opening. A second external conductive connection is disposed in the second opening and in contact with the first conductive portion.

According to some embodiments of the instant disclosure, a third chip is disposed on the third surface. The third chip has an active element and a fourth passive element electrically connected to the active element. The active element is electrically connected to the first conductive pad structure, and the third and second chip may have the same or different function.

Another aspect of the instant disclosure provides a method of manufacturing a chip package. The method includes firstly providing a first wafer. The first wafer includes a first substrate having a first surface and a second surface opposite to the first surface, a first passive element disposed on the first surface, a first protection layer covering the first passive element. The first protection layer has a third surface opposite to the first surface. The first chip also includes a first conductive pad structure and a second conductive pad structure disposed in the first protection layer and electrically connected to the first passive element. Next, a first opening is formed in the first protection layer to expose the first conductive pad structure. Subsequently, a second chip is formed. The second chip has an active element and a second passive element electrically connected to the active element. Finally, the second chip is connected to the third surface of the first wafer such that the active element being is connected to the first conductive pad structure.

According to some embodiments of the instant disclosure, the formation of second chip further includes providing a second wafer. The second wafer includes a second substrate, a second protection layer and a third conductive pad structure. The active element is disposed underneath the second substrate. The second protection layer is disposed underneath the second substrate and covers the active element. The third conductive pad structure is disposed in the second protection layer and electrically connected to the active element. Next, a second through hole is formed in the second protection layer to expose the third conductive pad structure. A second insulating layer is formed underneath the second protection layer and extending to the second through hole to cover the wall of the second through hole. Following that, a second conductive layer is formed underneath the second insulating layer and the third conductive pad structure. The second conductive layer includes a second conductive portion and the second passive element, and the second passive element and the second conductive portion are connected. Subsequently, a second barrier layer is formed to cover the second conductive layer. A third opening is formed in the second barrier layer to expose the second conductive portion. Finally, the second substrate, the second protection layer and the second barrier layer are cut along a second scribe line to form the second chip.

According to some embodiments of the instant disclosure, a second opening is formed in the first protection layer to expose the second conductive pad structure. The first opening and the second opening are formed in the same step. A second external conductive connection is formed in the second opening and in contact with the second conductive pad structure.

According to some embodiments of the instant disclosure, a first external conductive connection is formed in the third opening and in contact with the second conductive portion. The first external conductive connection is connected to the first conductive pad structure such that the first external conductive pad connection is in the first opening. The first wafer is cut along a first scribe line to form a chip package.

According to some embodiments of the instant disclosure, a first external conductive connection is formed in the first opening and in contact with the first conductive pad structure. The first external conductive connection is connected to the second conductive portion such that the first external conductive pad connection is in the third opening. The first wafer is cut along a first scribe line to form a chip package.

According to some embodiments of the instant disclosure, a first through hole is formed and extends from the second surface towards the third surface to expose the second conductive pad structure. A first insulation layer is formed underneath the second surface and extends to the first through hole and covers the wall of the first through hole. A first conductive layer is formed underneath the first insulation layer and second conductive pad structure. The first conductive layer includes a first conductive portion and a third passive element. The third passive element is connected to the first conductive portion.

According to some embodiments of the instant disclosure, a first barrier layer is formed to cover the first conductive layer. A second opening is formed in the first barrier layer to expose the first conductive portion. A second external conductive connection is formed in the second opening and in contact with the first conductive portion.

According to some embodiments of the instant disclosure, a first external conductive connection is formed in the third opening and in contact with the second conductive portion. The first external conductive connection is connected to the first conductive pad structure such that the first external conductive pad connection is in the first opening. The first wafer is cut along a first scribe line to form a chip package.

According to some embodiments of the instant disclosure, a first external conductive connection is formed in the first opening and in contact with the first conductive pad structure. The first external conductive connection is connected to the second conductive portion such that the first external conductive pad connection is in the third opening. The first wafer is cut along a first scribe line to form a chip package.

According to some embodiments of the instant disclosure, a third chip is formed. The third chip has an active element and a fourth passive element electrically connected to the active element. The third chip is connected to the third surface of the first wafer, such that the active element of the third chip is electrically connected to the first conductive pad structure. The third and second chip may have the same or different function.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 7 is a flow chart of manufacturing a chip package in accordance with an embodiment of the instant disclosure;

DETAILED DESCRIPTION

Figure 1:
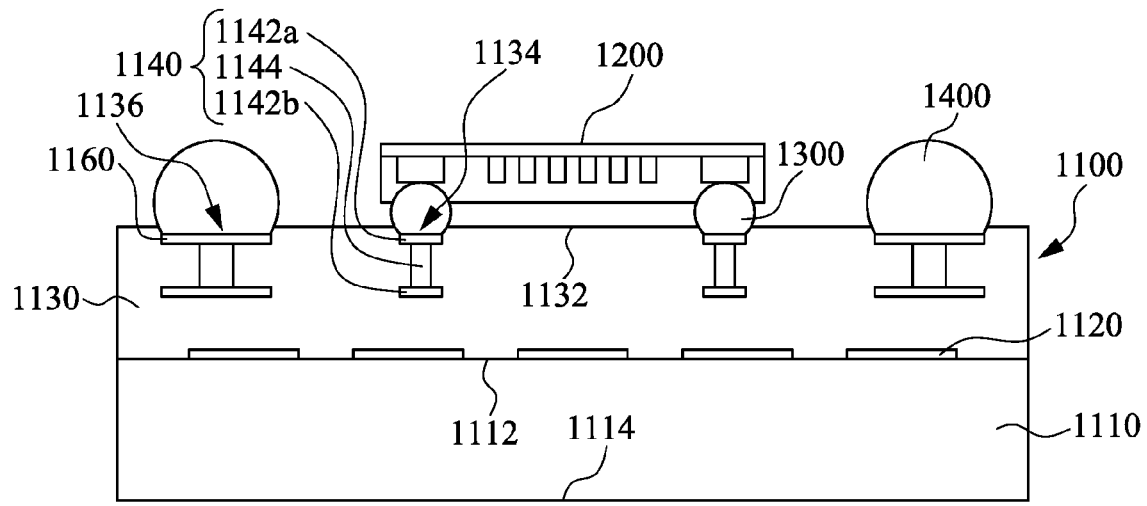
FIG. 1 is a cross-sectional view of a chip package in accordance with an embodiment of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1. FIG. 1 is a cross-sectional view of a chip package in accordance with an embodiment of the instant disclosure. As shown in FIG. 1, a chip package 1000 includes a first chip 1100, a second chip 1200, a plurality of first external conductive connection 1300 disposed in between the first chip 1100 and the second chip 1200, and a plurality of second external conductive connection 1400 surrounds the first external conductive connection 1300. The first external conductive connection 1300 allows the first chip 110 to be electrically connected to the second chip 1200, and the second external conductive connection 1400 is arranged to allow transmission of signals from the chip package 1000. For example, in the subsequent process, the chip package 1000 is packed to a printed circuit board, and the second external conductive connection 1400 can transmit signals to the printed circuit board. In addition, the second external conductive connection 1400 has a size larger than the first external conductive connection 1300. In some embodiments of the instant disclosure, the chip package 1000 may be RF sensor, but the instant disclosure is not limited thereto. In some embodiments of the instant disclosure, the first external conductive connection 1300 and the second external conductive connection 1400 are soldering balls, bumps or any other suitable structure. The shape of the external conductive connection may be round, oval, square, rectangle or any other geometrical configurations.

The first chip 1100 includes a first substrate 1110, a first passive element 1120, a first protection layer 1130, a first conductive pad structure 1140, and a second conductive pad structure 1160. It should be understood that the first conductive pad structure 1140 includes a plurality of first conductive pads 1142a and 1142b and a plurality of wires 1144 electrically connecting the first conductive pads 1142a and 1142b. The second conductive pad structure 1160 has a structure resembling the first conductive pad structure 1140, and it is not repeated to avoid redundancy.

The first substrate 1100 has a first surface 1112 and a second surface 1114 opposite to the first surface 1112. The first passive element 1120 is disposed on the first surface 1112. In some embodiments of the instant disclosure, a material of the first substrate 1110 includes silicon, silicon nitride or a combination thereof, and the instant disclosure is not limited thereto. In some embodiments of the instant disclosure, the first passive element 1120 may be a capacitive element, electrical-sensing element or resistor element. In some embodiments of the instant disclosure, the first passive element 1120, the first conductive pad structure 1140 and the second conductive pad structure 1160 are made of aluminium, copper, nickel or any other suitable electrically conductive material. In some embodiments of the instant disclosure, the first passive element 1120 has a shape resembling "U", planar spiral or stereoscopic spiral.

The first protection layer 1130 is disposed on the first surface 1112 and covers the first passive element 1120. The first protection layer 1130 has a third surface 1132 opposite to the first surface 1112. The first conductive pad structure 1140 and the second conductive pad structure 1160 are disposed in the first protection layer 1130. The first conductive pad structure 1140 and the second conductive pad structure 1160 are therefore electrically connected to the first passive element 1120 through the conductive body of the first protection layer 1130. The second conductive pad structure 1160 surrounds the first conductive pad structure 1140. More specifically, the first protection layer 1130 may include an interlayer dielectric layer (ILD), inter metal dielectric layer (IMD), passivation layer and interconnection. The first conductive pad structure 1140 and the second conductive pad structure 1160 may be electrically connected to the first passive element 1120 through the interconnection. In addition, the first protection layer 1130 is formed with a first opening 1134 and a second opening 1136 on the third surface 1132. The first opening 1134 exposes the first conductive pad structure 1140, and the second opening 1136 exposes the second conductive pad structure 1160. The first chip 1100 does not contain any active element.

Figure 2:
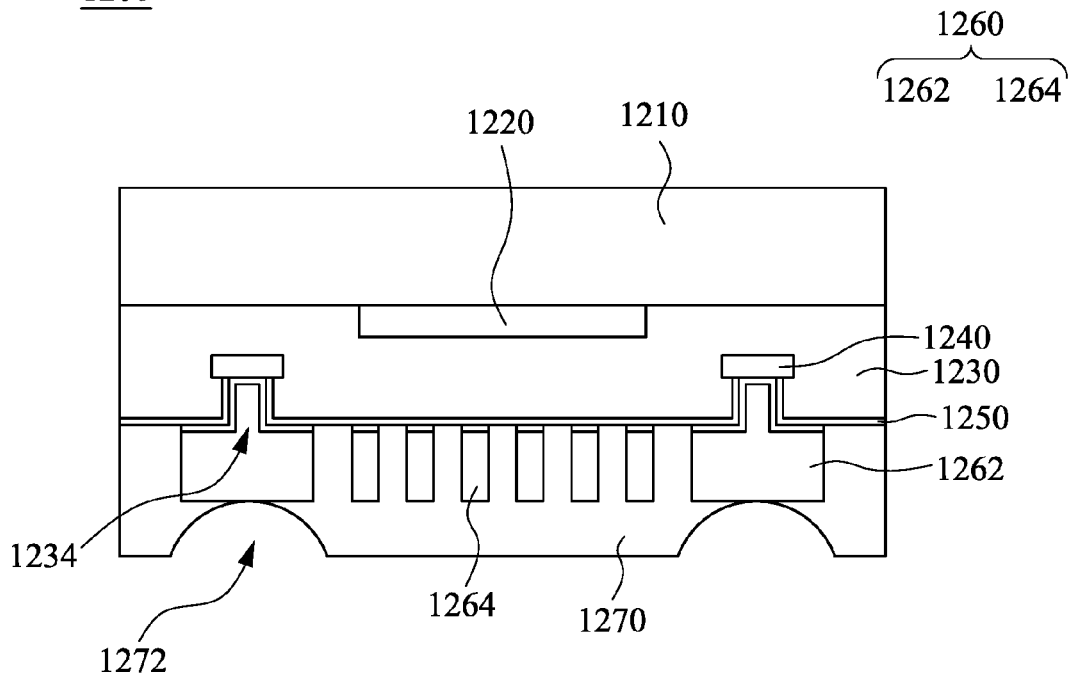
FIG. 2 is an enlarged view of a portion of FIG. 1.

Please refer to FIG. 2. FIG. 2 is an enlarged view of the second chip 1200 in FIG. 1. As shown in FIG. 2, the second chip 1200 includes a second substrate 1210, an active element 1220, a second protection layer 1230, a third conductive pad structure 1240, a second insulation layer 1250, a second conductive layer 1260 and a second barrier layer 1270. The active element 1220 is disposed underneath the second substrate 1210, and the second protection layer 1240 is disposed underneath the second substrate 1210 and covers the active element 1220. The third conductive pad structure 1240 is disposed in the second protection layer 1230 and electrically connected to the active element 1220 through the conductive body in the second protection layer 1230. More specifically, the third conductive pad structure 1240 is electrically connected to the active element 1220 through the interconnection in the second protection layer 1230. In some embodiments of the instant disclosure, the active element 1220 is a complementary metal oxide semiconductor (CMOS).

The second protection layer 1230 is formed with a second through hole 1234 to expose the third conductive pad structure 1240. The second insulation layer 1250 is disposed underneath the second protection layer 1230 and extends to the second through hole 1234 to cover the wall of the second through hole 1234. In some embodiments of the instant disclosure, a material of the second insulation layer 1250 includes silicon oxide, silicon nitride, silicon oxynitride or any other suitable insulation material. The second conductive layer 1260 is disposed underneath the second insulation layer 1250, and a portion of the second conductive layer 1260 is disposed in the second through hole 1234, being in contact with the third conductive pad structure 1240. It should be noted that the second conductive layer 1260 includes a second conductive portion 1262 and a second passive element 1264. The second conductive portion 1262 is employed to electrically connect the third conductive pad structure 1240 exposed from the second through hole 1234 such that the active element 1220 can transmit signals to external environment through the third conductive pad structure 1240 and the second conductive portion 1262. The second passive element 1264 may be formed simultaneously with the second conductive portion 1262 and connected to the second conductive portion 1262 such that the second passive element 1264 is electrically connected to the second conductive portion 1262. As a result, the active element 1220 may control the second passive element 1264. In some embodiments of the instant disclosure, the second passive element 1264 has a shape resembling "U", planar spiral or stereoscopic spiral. In some embodiments of the instant disclosure, a material of the third conductive pad structure 1240 and the second conductive layer 1260 is aluminium, copper, nickel or any other suitable conductive material.

The second barrier layer 1270 covers the second conductive portion 1262 and the second passive element 1264 of the second conductive layer 1260. The second barrier layer 1270 is also formed with a third opening 1272 to expose the second conductive portion 1262. In some embodiments of the instant disclosure, a material of the second barrier layer 1270 is epoxy resin, for example, solder mask.

The internal structure of the second chip 1200 is described. Please refer back to FIG. 1. As shown in FIG. 1, the first external conductive connection 1300 is disposed in between the first chip 1100 and the second chip 1200. More specifically, the first external conductive connection 1300 is disposed in between the first conductive pad structure 1140 and the third conductive pad structure 1240, and a portion of the first external conductive connection 1300 is disposed in the first opening 1134, being in contact with the first conductive pad structure 1140. A portion of the first external conductive connection 1300 is disposed in the third opening 1272, being in contact with the second conductive portion 1262. As a result, the active element 1220 is electrically connected to the first passive element 1120 through the third conductive pad structure 1240, the second conductive portion 1262, the first external conductive connection 1300 and the first conductive pad structure 1140. The second external conductive connection 1400 is disposed in the second opening 1136 and in contact with the second conductive pad structure 1160.

Due to the presence of passive elements in the first chip 1100 and the second chip 1200, the function and application of the chip package 1000 are increased. In some embodiments of the instant disclosure, the first passive element 1120 and the second passive element 1264 are the inductor of the chip package 1000, and the first passive element 1120 and the second passive element 1264 may have different inductance value. For example, the first chip 1100 has larger size, such that the first passive element 1120 is not confined by the processing limitation. The first passive element 1120 may have larger size such that the inductance value is elevated, and Q value is improved. The overall resistor wearing off is reduced, and the efficiency of the chip package 1000 is increased.

According to some embodiments of the instant disclosure, a third chip (not shown) is disposed on the first chip 1100. The third chip has an active element and a fourth passive element electrically connected to the active element. The active element of the third chip is electrically connected to the first conductive pad structure 1140. The third chip shares a similar structure as the second chip 1200. It is not repeated hereinafter to avoid redundancy. The third chip and the second may have the same or different function.

Figure 3:
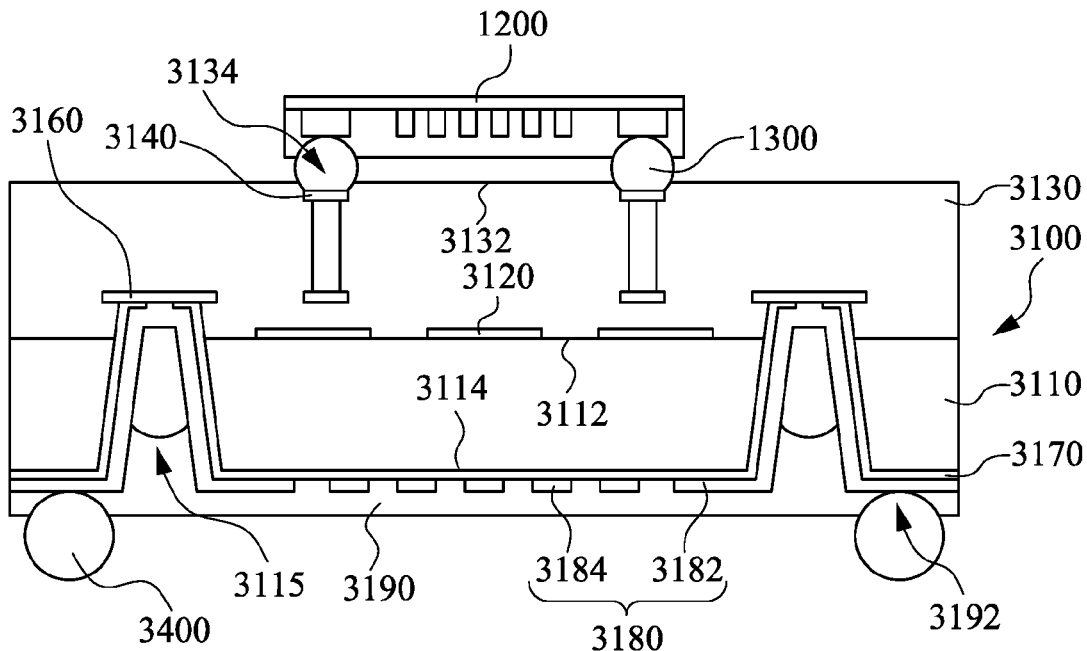
FIG. 3 is a cross-sectional view of a chip package in accordance with an embodiment of the instant disclosure.
Figure 4:
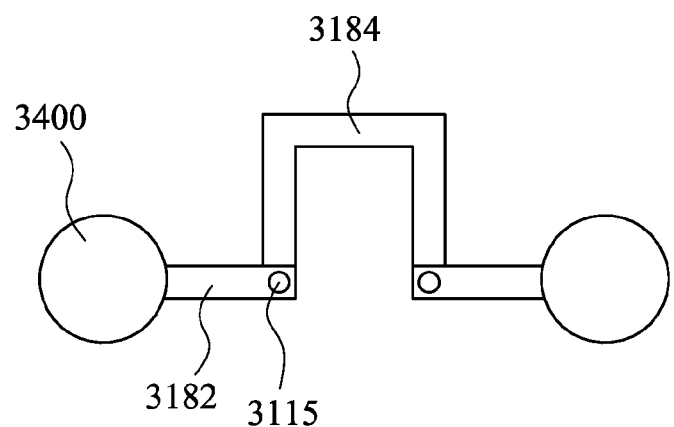
FIG. 4 is a circuit layout of a first conductive layer of the chip package shown in FIG. 3.

Please refer to FIGS. 3 and 4. FIG. 3 is a cross-sectional view of a chip package in accordance with an embodiment of the instant disclosure, and FIG. 4 is a circuit layout of a first conductive layer of the chip package shown in FIG. 3. A chip package 3000 includes a first chip 3100, a second chip 1200, a plurality of first external conductive connections 1300 disposed in between the first chip 3100 and the second chip 1200, and a plurality of second external conductive connections 3400. The first external conductive connections 1300 allow the first chip 3100 to be electrically connected to the second chip 1200. The internal structure of the second chip 1200 is similar to that shown in FIG. 2. It is not repeated hereinafter to avoid redundancy.

The first chip 3100 includes a first substrate 3110, a first passive element 3120, a first protection layer 3130, a first conductive pad structure 3140, and a second conductive pad structure 3150. The first substrate 3110 has a first surface 3112 and a second surface 3114 opposite to the first surface 3112. The first passive element 3120 is disposed on the first surface 3112. The first protection layer 3130 is disposed on the first surface 3112 and covers the first passive element 3120. The first protection layer 3130 has a third surface 3132 opposite to the first surface 3112. The first conductive pad structure 3140 and the second conductive pad structure 3160 are disposed in the first protection layer 3130. The first conductive pad structure 3140 and the second conductive pad structure 3160 are therefore electrically connected to the first passive element 3120 through the conductive body of the first protection layer 3130. The second conductive pad structure 3160 surrounds the first conductive pad structure 3140. More specifically, the first conductive pad structure 3140 and the second conductive pad structure 3160 may be electrically connected to the first passive element 3120 through the interconnection.

The third surface 3132 of the first protection layer 3130 is formed with a first opening 3134, and the first opening 3134 exposes the first conductive pad structure 3140. The difference between the chip package 3000 and the chip package 1000 arises from the opening. The first protection layer 3130 is not formed with a second opening that can expose the second conductive pad structure 3160. The chip package 3000 is formed with a first through hole 3115 going through from the second surface 3114 of the first substrate 3110 toward the third surface of the first protection layer 3130 so as to expose the second conductive pad structure 3160. A first insulation layer 3170 is disposed underneath the second surface 3114 and extends to the first through hole 3115 to cover the wall of the first through hole 3115.

A first conductive layer 3180 is disposed underneath the first insulation layer 3170, and a portion of the first conductive layer 3180 is disposed in the first through hole 3115 so as to be in contact with the second conductive pad structure 3160. It should be noted that the first conductive layer 3180 includes a first conductive portion 3182 and a third passive element 3184. The first conductive portion 3182 is disposed underneath the first insulation layer 3170, and a portion of the first conductive portion 3182 is disposed in the first through hole 3115 and in contact with the second conductive pad structure 3160. The third passive element 3184 is also disposed underneath the first insulation layer 3170, and one end of the third passive element 3184 is connected to the to the first conductive portion 3182. In some embodiments of the instant disclosure, a shape of the third passive element 3184 resembles "U", but the instant disclosure is not limited thereto. A designer can has different circuit layout according to the requirement of the first conductive layer 3180 such that the third passive element 3184 may have other shapes, for example, planar spiral or stereoscopic spiral. In some embodiments of the instant disclosure, the chip package 3000 further includes a magnetic element so as to elevate an inductance value of the chip package 3000, and the magnetic element is surrounded by the third passive element 3184.

In this embodiment, in addition to the first passive element 3120, the first conductive layer 3180 of the first chip 3100 has a third passive element 3184. For example, the first passive element 3120 and the third passive element 3184 may be used as inductor elements of the chip package 3000 such that inductance value of the chip package 3000 may be increased. When the first conductive layer 3180 is patterned, the first conductive portion 3182 and the third passive element 3184 are formed simultaneously. As a result, the time of fabricating the third passive element 3184 is reduced. Alternatively, the first passive element 3120 can be omitted in the first chip 3100 so as to reduce complexity in design. In some embodiments of the instant disclosure, the first chip 3100 does not require conventional independent inductor (e.g., the first passive element 3120), and the first chip 3100 can have inductor function. Consequently, manufacturing time is greatly reduced, and the cost of forming conventional inductor is waived.

The first chip 3100 further includes a first barrier layer 3190 covering the first conductive portion 3182 and the third passive element 3184. The first barrier layer 3190 is formed with the second opening 3192 to expose the first conductive portion 3182 of the first conductive layer 3180. A second external conductive connection 3400 is disposed in the second opening 3192 and in contact with the first conductive portion 3182. The second external conductive connection 3400 is arranged in a manner for transmitting signals of the chip package 3000. For example, in the subsequent process, the chip package 3000 is packaged on a printed circuit board, and the second external conductive connection 3400 may be transmit signals to the printed circuit board.

Similar to the chip package 1000, in the chip package 3000, a portion of the first external conductive connection 1300 is disposed in the first opening 3134, being in contact with the first conductive pad structure 3140. A portion of the first external conductive connection 1300 is disposed in the third opening 1272, being in contact with the second conductive portion 1262. As a result, the active element 1220 is electrically connected to the first passive element 3120 through the third conductive pad structure 1240, the second conductive portion 1262, the first external conductive connection 1300 and the first conductive pad structure 3140.

Figure 5:
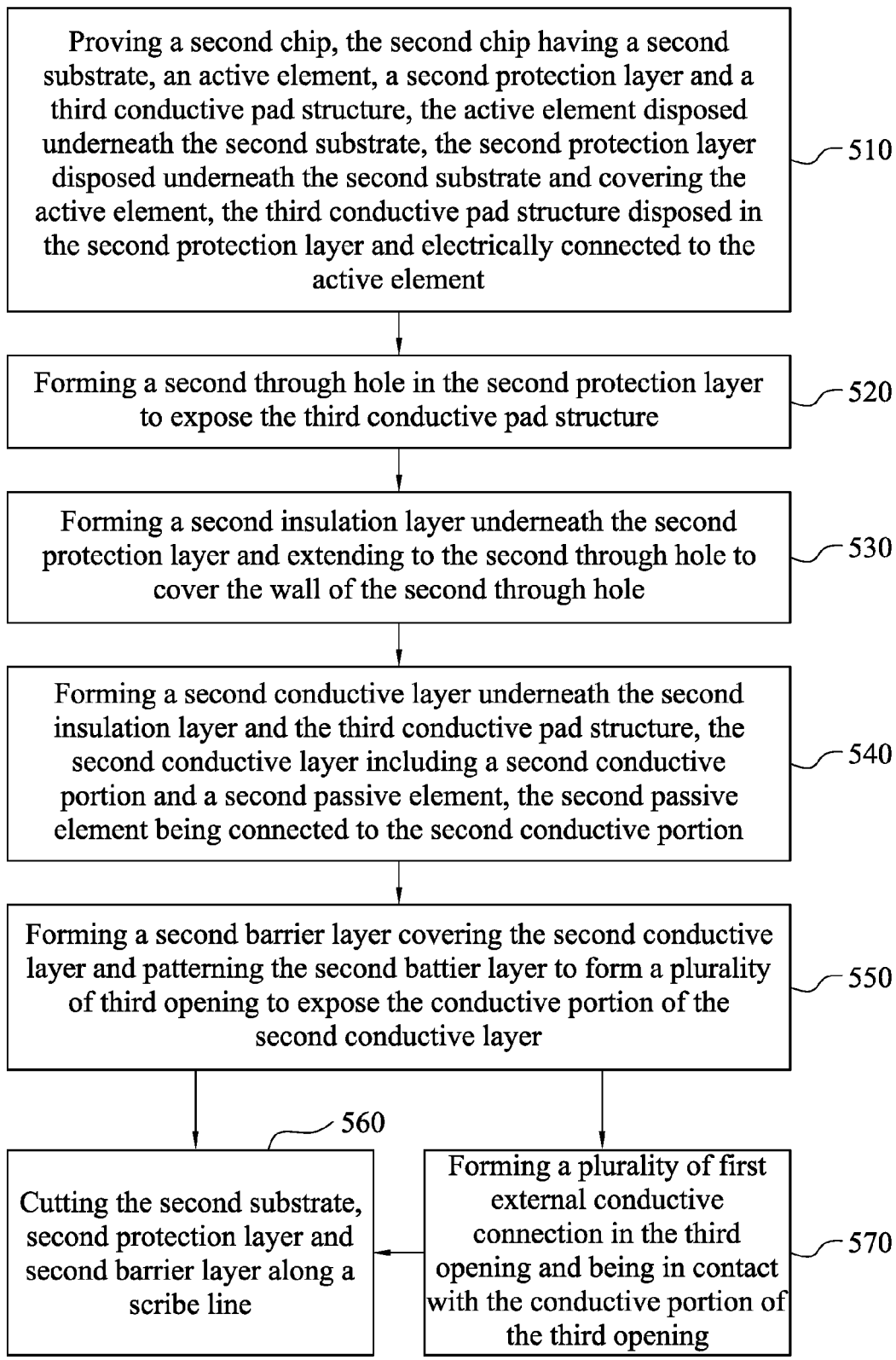
FIG. 5 is a flow chart of manufacturing a second chip in accordance with an embodiment of the instant disclosure.

A method of manufacturing a chip package is elaborated hereinafter. Please refer to FIGS. 5 and 6A-6F which describe a method of manufacturing the second chip shown in FIG. 2. FIG. 5 is a flow chart of manufacturing a second chip in accordance with an embodiment of the instant disclosure. FIGS. 6A-6F illustrating cross-sectional views of manufacturing the second chip shown in FIG. 2.

Figure 6A:
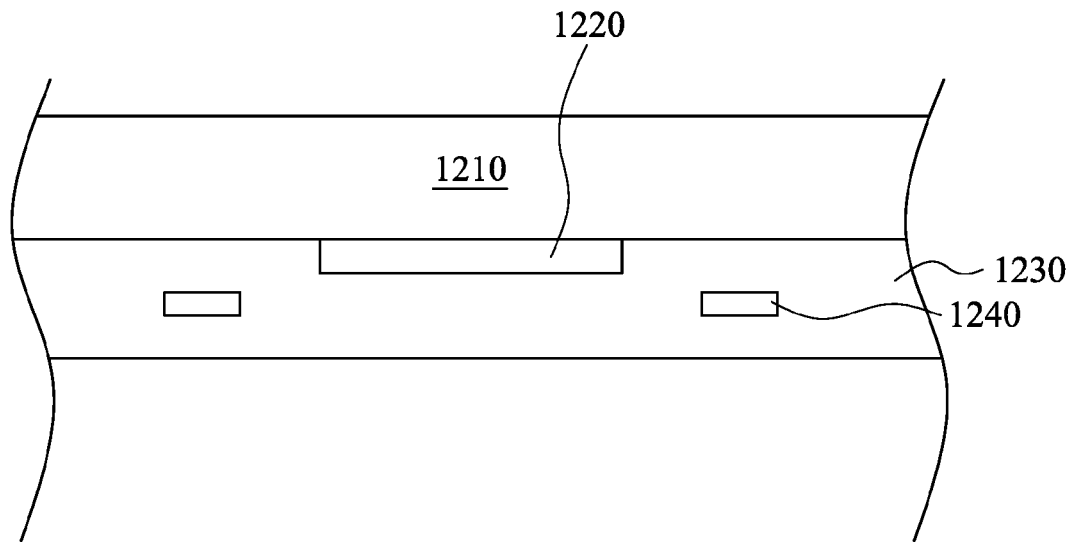
FIGS. 6A-6F illustrating cross-sectional views of manufacturing the second chip shown in FIG. 2.

As set forth in step 510, it is illustrated in FIG. 6A. In step 510, a second wafer 6200 is provided. The second wafer 6200 has a second substrate 1210, an active element 1220, a second protection layer 1230 and a third conductive pad structure 1240. The active element 1220 is disposed underneath the second substrate 1210. The second protection layer 1230 covers the active element 1220. The third conductive pad structure 1240 is disposed in the second protection layer 1230 and electrically connected to the active element 1220. The second wafer 6200 refers to a semiconductor structure before proceeding to the cutting of the second chip 1200.

Figure 6B:
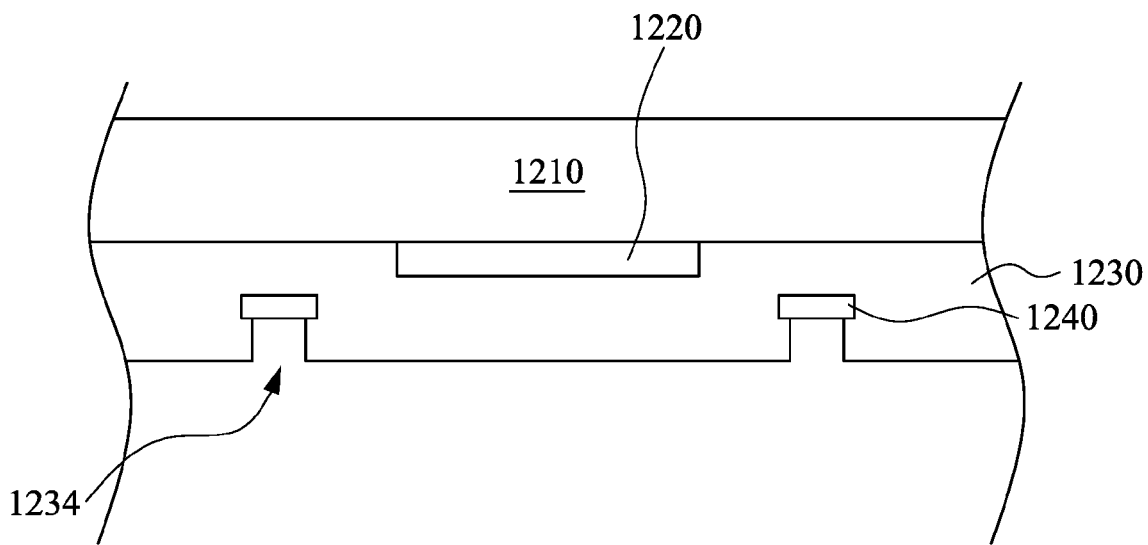

Next, step 520 is performed, and it is illustrated in FIG. 6B. In step 520, a second through hole 1234 is formed in the second protection layer 1230 to expose the third conductive pad structure 1240. The method of forming the second through hole 1234 includes, for example, photolithography etching, and the instant disclosure is not limited thereto.

Figure 6C:
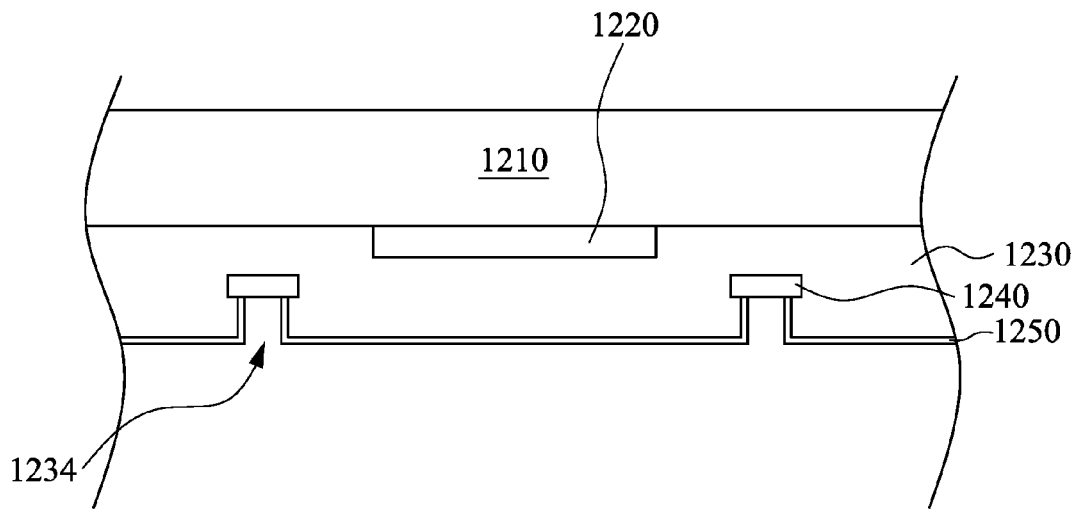

Next, step 530 is performed, and it is illustrated in FIG. 6C. In step 530, a second insulation layer 1250 is formed underneath the second protection layer 1230 and extends to the second through hole 1234 to cover the wall of the second through hole 1234. In step 530, the second insulation layer 1250 is formed to cover the second protection layer 130 and the second through hole 1234. Subsequently, a portion of the second insulation layer 1234 is removed by photolithography etching such that the third conductive pad structure 1240 is exposed from the second through hole 1234.

Figure 6D:
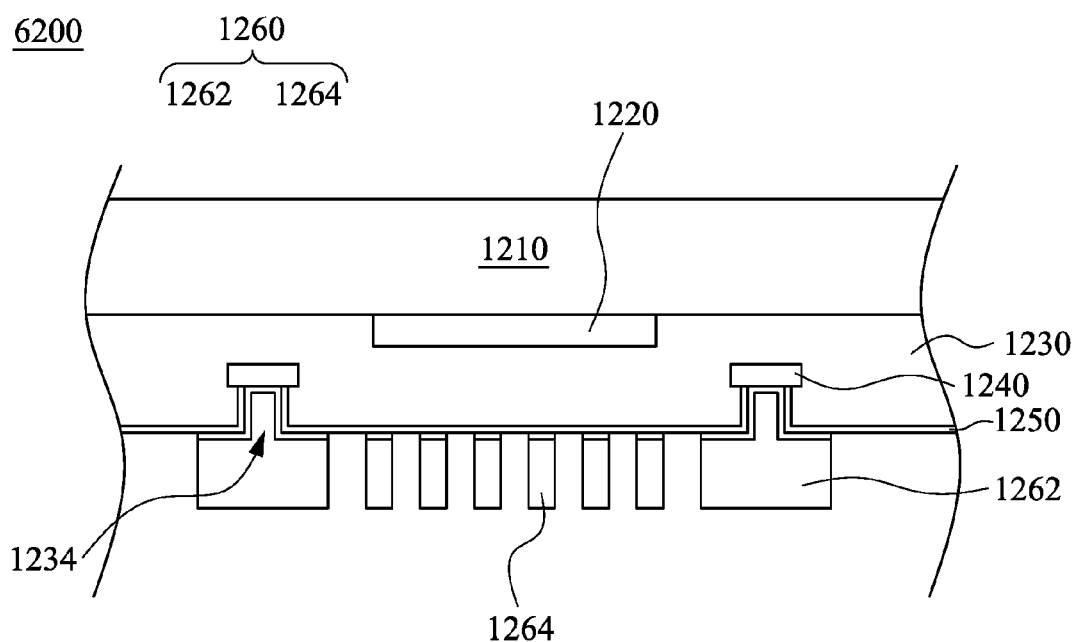

Next, step 540 is performed, and it is illustrated in FIG. 6D. In step 540, a second conductive layer 1260 is formed underneath the second insulation layer 1250 and the third conductive pad structure 1240. The second conductive layer 1260 includes a second conductive portion 1262 and a second passive element 1264. The second passive element 1264 is connected to the second conductive portion 1262. In step 540, a conductive material may be formed by sputtering, evaporation deposition, electroplating or non-electroplating underneath the second insulation layer 1250 and the third conductive pad structure 1240 in the second through hole 1234. Subsequently, the conductive material is patterned to form the second passive element 1264 and the second conductive portion 1262 that surrounds the second passive element 1264. One end of the second passive element 1264 is connected with the second conductive portion 1262. The second passive element 1264 and the second conductive portion 1262 are formed in the same processing step.

Figure 6E:
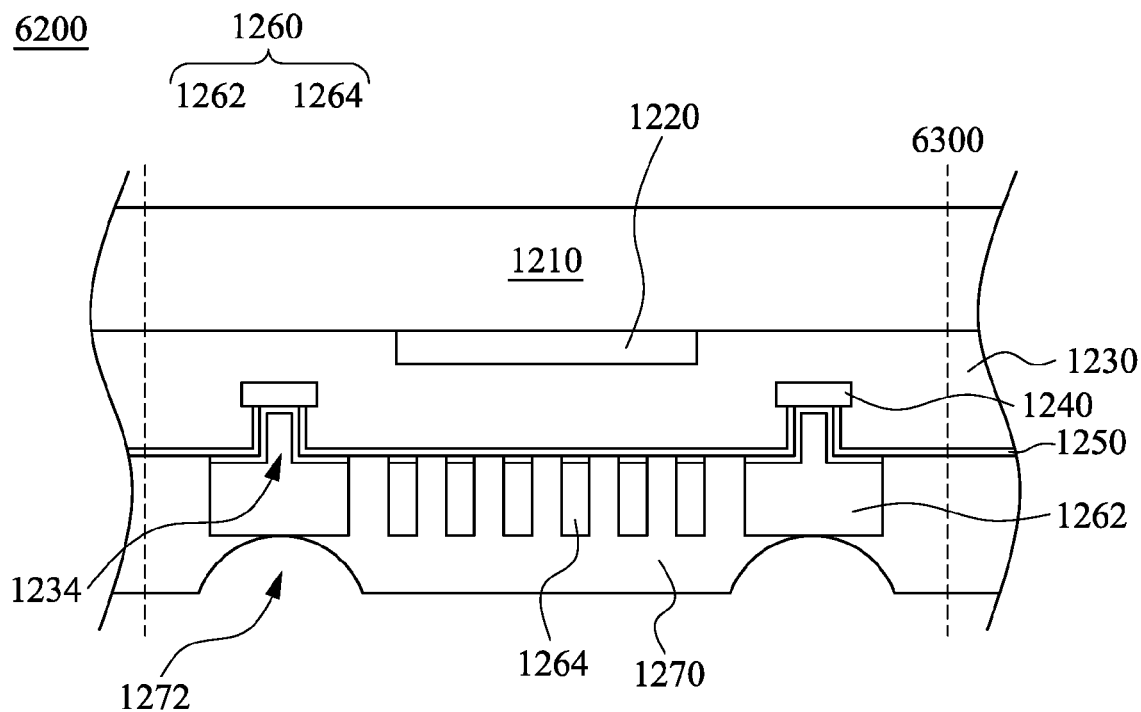

Next, step 550 is performed, and it is illustrated in FIG. 6E. In step 550, a second barrier layer 1270 is formed to cover the second conductive layer r1260, and the second barrier layer 1270 is patterned to formed a plurality of third opening 1272 to expose the second conductive portion 1262 of the second conductive layer 1260. The second barrier layer 1270 may be formed by brushing a epoxy resin material on the second conductive layer 1260. Subsequently, the second barrier layer 1270 is patterned to form the third openings 1272 such that a portion of the second conductive portion 1262 is exposed on the third opening 1272 of the second barrier layer 1270.

Finally, step 560 is performed, and it is illustrated in FIG. 6E. In step 560, after the formation of the third opening 1272, the second substrate 1210, second protection layer 1230 and second barrier layer 1270 are cut along a scribe line 6300 to form the second chip 1200 as shown in FIG. 2.

Figure 6F:
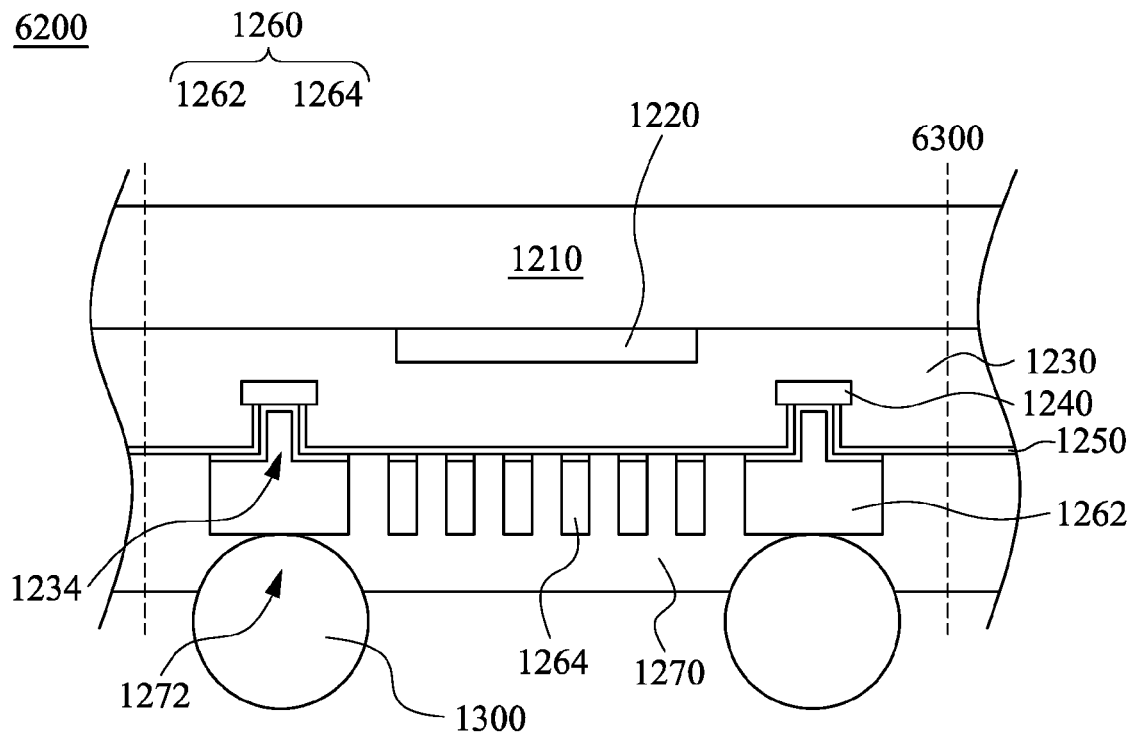

Alternatively, before proceeding to step 6, step 570 is conducted, and it is illustrated in FIG. 6F. In some embodiments of the instant disclosure, after the formation of the third opening 1272, a first external conductive connection 1300 is formed in the third opening 1272 so as to expose the second conductive portion 1262 in the third opening 1272. After the first external conductive connection 1300 is formed, the second substrate 1210, second protection layer 1230 and second barrier layer 1270 are cut along a scribe line 6300 to form a second chip 1200 having a first external conductive connection 1300.

Please refer to FIGS. 7 and 8A-8D, which illustrate a method of manufacturing a chip package as shown in FIG. 1. FIG. 7 is a flow chart of manufacturing a chip package in accordance with an embodiment of the instant disclosure. FIGS. 8A-8D illustrating cross-sectional views of manufacturing the chip package shown in FIG. 1.

Figure 8A:
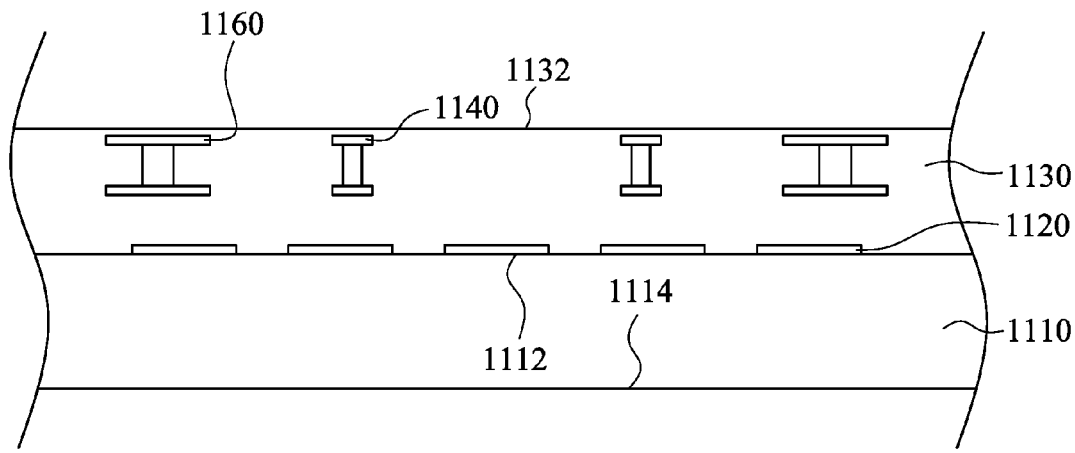
FIGS. 8A-8D illustrating cross-sectional views of manufacturing the chip package shown in FIG. 1.

As set forth in step 710, it is illustrated in FIG. 8A. In step 710, a first wafer 8100 is provided. The first chip 8100 including a first substrate 1100 having a first surface 1112 and a second surface 1114 opposite to the first surface. A first passive element 1120 is disposed on the first surface 1112. A first protection layer 1130 covers the first passive element 1120. The first protection layer 1130 has a third surface 1132 opposite to the first surface 1112. A first conductive pad structure 1140 and a second conductive pad structure 1160 are disposed in the first protection layer 1130 and electrically connected to the first passive element 1120. The second conductive pad structure 1160 surrounds and is electrically connected to the first conductive pad structure 1140. The first wafer 8100 refers to a semiconductor structure of the first chip 1100 shown in FIG. 1 before proceeding to cutting.

Figure 8B:
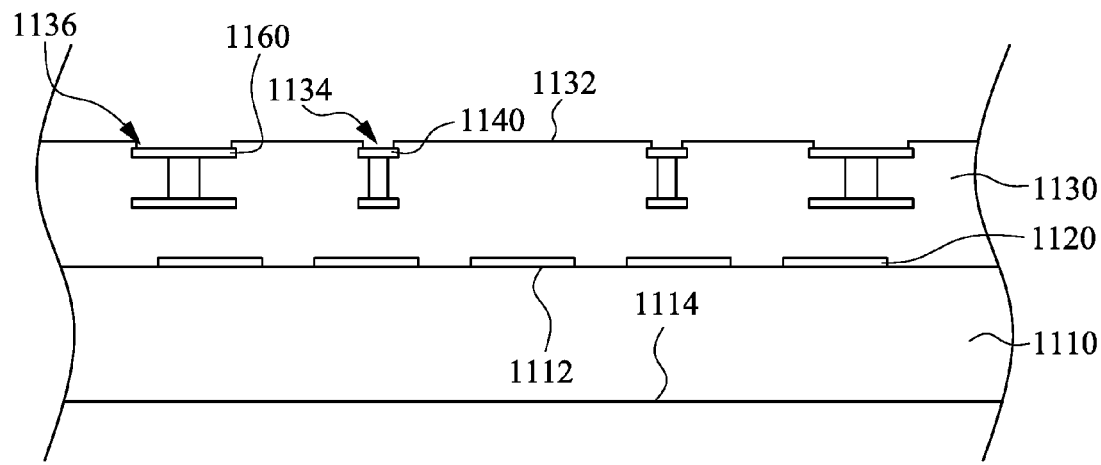

Next, step 720 is performed, and it is illustrated in FIG. 8B. In step 720, a first opening 1134 is formed in the first protection layer 1130 to expose the first conductive pad structure 1140. A second opening 1136 is formed in the first protection layer 1130 to expose the second conductive pad structure 1150. The method of forming the first opening 1134 and the second opening 1136 may be, for example, photolithography etching, and the instant disclosure is not limited thereto. The first opening 1134 and the second opening 1136 are formed in the same processing step.

Figure 8C:
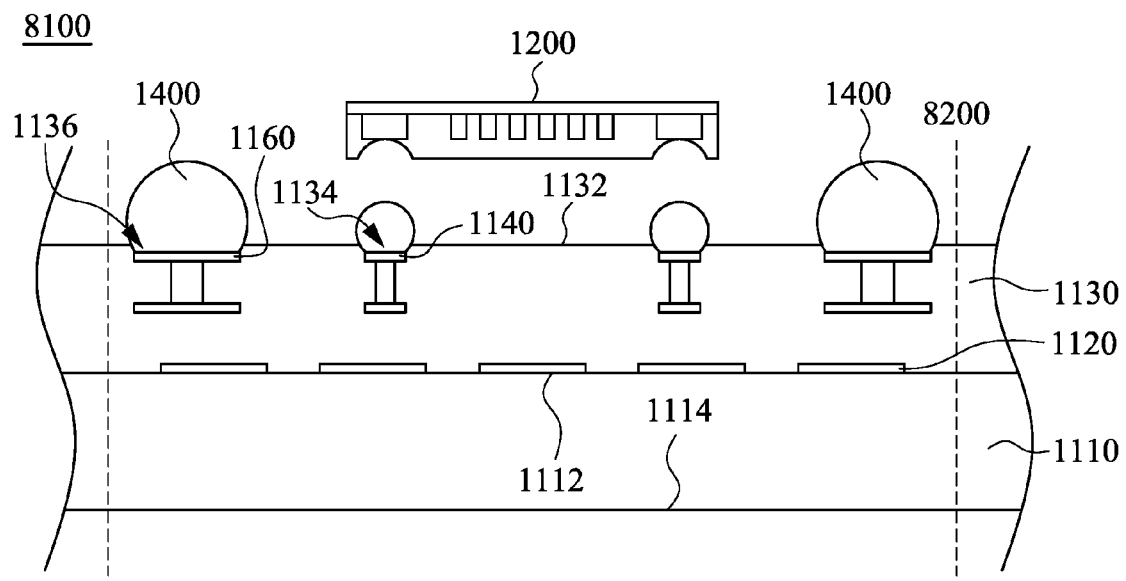

Next, step 730 is performed, and it is illustrated in FIG. 8C. A first external conductive connection 1300 is formed in the first opening 1134. A second external conductive connection 1400 is formed in the second opening 1136. In this way, the first external conductive connection 1300 can be in contact with the first conductive pad structure 1140 that is exposed on the first opening 1134. The second external conductive connection 1400 can be in contact with the second conductive pad structure 1160 that is exposed on the second opening 1136. In some embodiments of the instant disclosure, the first external conductive connection 1300 and the second external conductive connection 1400 are formed in the same processing step.

Next, step 750 is performed, and it is illustrated in FIG. 8C. In step 750, the second chip 1200 is connected to the third surface 1132 of the first wafer 8100 such that the active element 1220 is electrically connected to the first conductive pad structure 1140. The first external conductive connection 1300 is formed in the first opening 1134 in the previous step as shown in FIG. 8C. As a result, the second chip 1200, which is shown in FIG. 6E and does not have the first external conductive connection 1300 may be used. Subsequently, the first external conductive connection 1300 is connected to the second conductive portion 1262, such that a portion of the first external conductive connection 1300 is positioned in the third opening 1272.

Finally, step 760 is performed, and it is illustrated in FIG. 8C. In step 760, the first wafer 8100 is cut along a first scribe line 8200 to form a chip package 1000. After the first wafer 8100 and the second chip 1200 are combined, the first wafer 8100 is cut along the first scribe line 8200 to form the chip package 1000 as shown in FIG. 1.

According to some embodiments of the instant disclosure, a third chip (not shown) is formed on the first wafer 8100. The third chip has an active element and a fourth passive element electrically connected to the active element. The third chip is connected to the third surface 1132 of the first wafer 8100 such that the active element of the third chip is electrically connected to the first conductive pad structure 1140. The third chip shares a similar structure as the second chip 1200. It is not repeated hereinafter to avoid redundancy. The third chip and the second may have the same or different function.

Figure 8D:
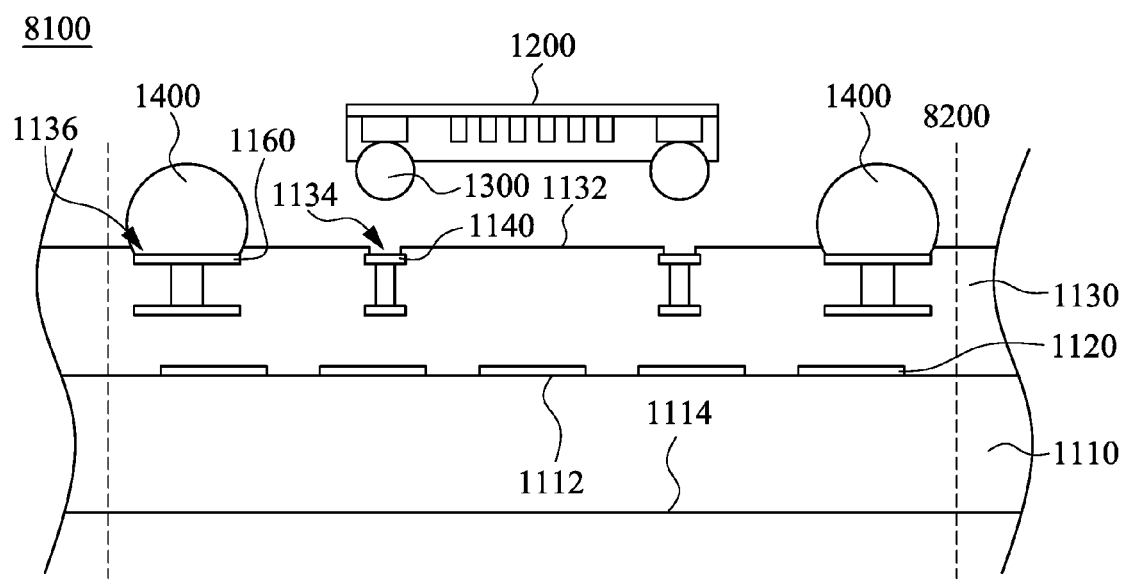

In some embodiments of the instant disclosure, after step 720, step 740 is performed. It is illustrated in FIG. 8D. In step 740, a second external conductive connection 1400 is formed in the second opening 1136.

After step 740, step 750 is conducted. The second chip 1200 is connected to the third surface 1132 of the first wafer 8100 such that the active element 1220 is electrically connected to the first conductive pad structure 1140. In FIG. 8D, the first external conductive connection 1300 is not disposed in the first opening 1134, such that the second chip 1200 having the first external conductive portion 1300 shown in FIG. 6F can be used. Subsequently, the first external conductive connection 1300 and the first conductive pad structure 1140 are connected, such that the first external conductive connection 1300 is disposed in the first opening 1134.

Finally, step 760 is performed, and it is illustrated in FIG. 8D. In step 760, the first wafer 8100 is cut along a first scribe line 8200 to form a chip package 1000. After the first wafer 8100 and the second chip 1200 are combined, the first wafer 8100 is cut along the first scribe line 8200 to form the chip package 1000 as shown in FIG. 1.

Figure 9:
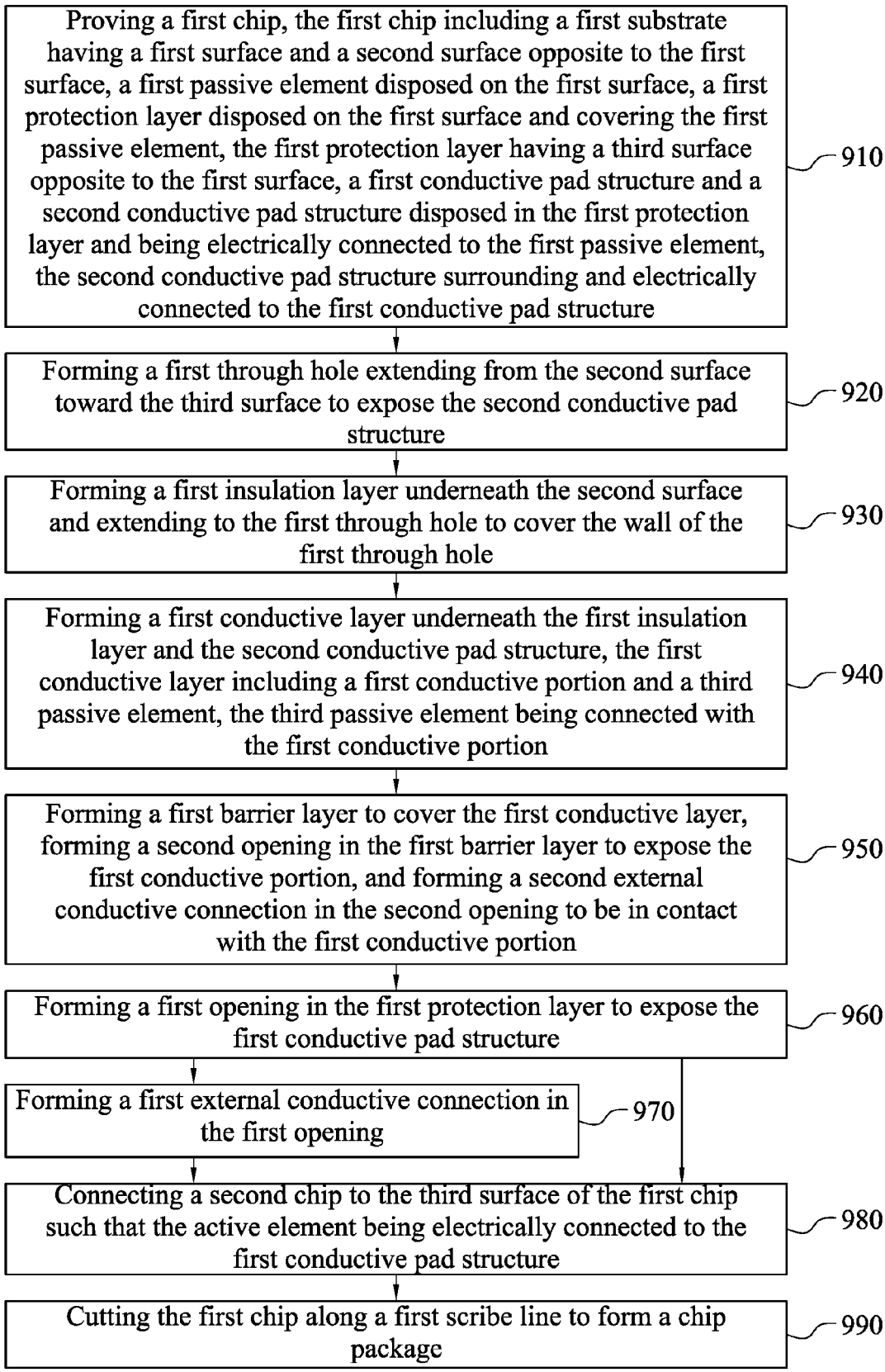
FIG. 9 is a flow chart of manufacturing a chip package in accordance with an embodiment of the instant disclosure.

Please refer to FIGS. 9 and 10A-10H, illustrating a method of manufacturing the chip package shown in FIG. 3. FIG. 9 is a flow chart of manufacturing a chip package in accordance with an embodiment of the instant disclosure. FIGS. 10A-10H illustrate cross-sectional views of manufacturing the chip package shown in FIG. 3.

Figure 10A:
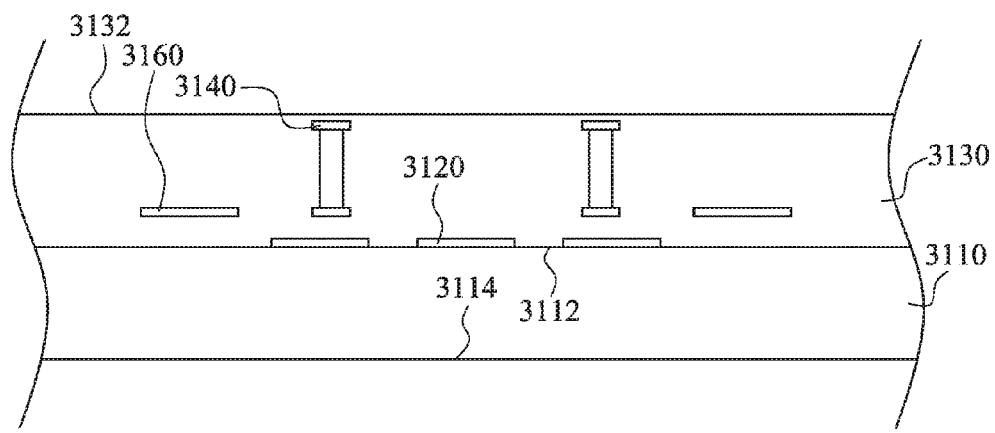
FIGS. 10A-10H illustrating cross-sectional views of manufacturing the chip package shown in FIG. 3.

As set for in step 910, it is illustrated in FIG. 10A. In step 910, a first wafer 11100 is provided. The first wafer 11100 includes a first substrate 3100 having a first surface 3112 and a second surface 3114 opposite to the first surface 3112. A first passive element 3120 is disposed on the first surface 3112. A first protection layer 3130 covers the first passive element 3120, and the first protection layer 3130 has a third surface 3132 opposite to the first surface 3112. A first conductive pad structure 3140 and a second conductive pad structure 3160 are disposed in the first protection layer 3130 and electrically connected to the first passive element 3120. The second conductive pad structure 3160 surrounds and is electrically connected to the first conductive pad structure 3140. The first wafer 11100 refers to a semiconductor structure as shown in FIG. 3 before proceeding to the cutting.

Figure 10B:
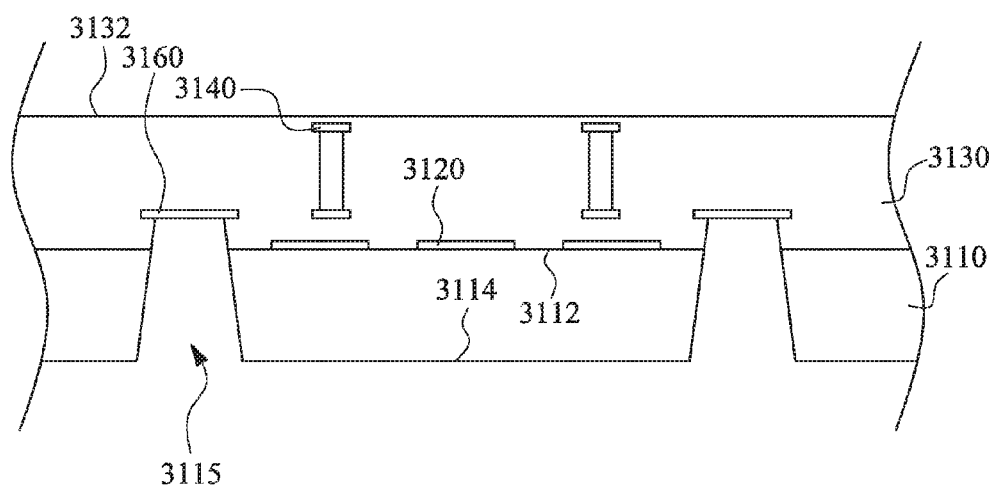

Next, step 920 is performed, and it is illustrated in FIG. 10B. In step 920, a first through hole 3115 is formed and extending from the second surface 3114 toward the third surface 3132 to expose the second conductive pad structure 3150. The method of forming the first through hole includes, for example, photolithography etching, and the instant disclosure is not limited thereto.

Figure 10C:
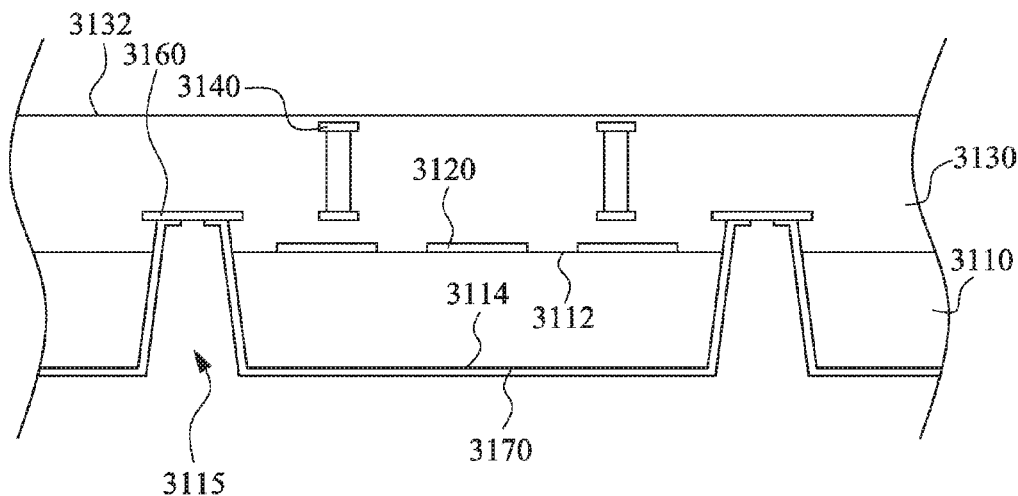

Next, step 930 is performed, and it is illustrated in FIG. 10C. In step 930, a first insulation layer 3170 is formed underneath the second surface 3114 and extending to the first through hole 3115 to cover the wall of the first through hole 3115. In step 930, the first insulation layer 3170 is formed firstly to cover the second surface 3114 and the first through hole 3115. Next, a portion of the first insulation layer 3170 is removed by photolithography etching such that the second conductive pad structure 3160 in the first through hole 3115 is exposed.

Figure 10D:
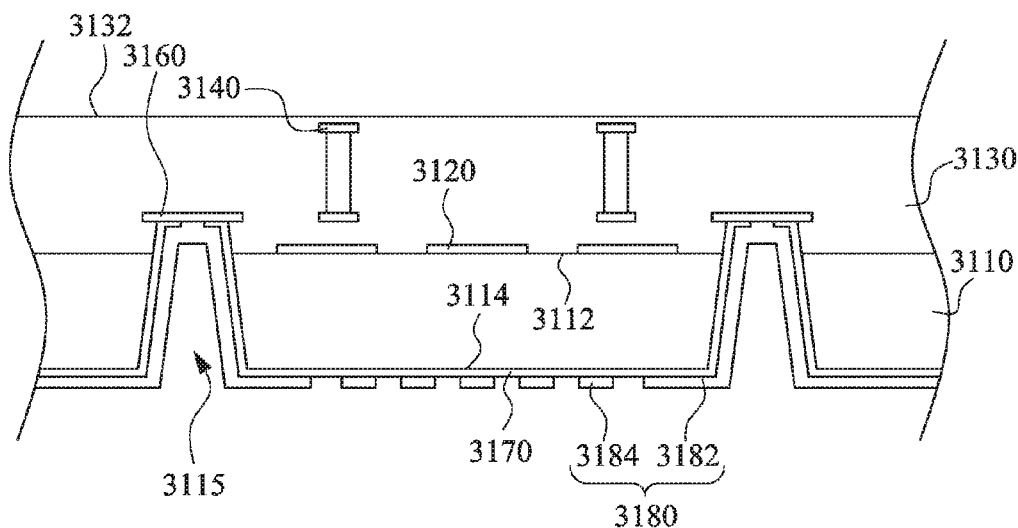

Next, step 940 is performed, and it is illustrated in FIG. 10D. In step 940, a first conductive layer 3180 is formed underneath the first insulation layer 3170 and the second conductive pad structure 3160. The first conductive layer 3180 includes a first conductive portion 3182 and a third passive element 3184. The third passive element 3184 is connected with the first conductive portion 3182. In step 940, a conductive material may be formed by sputtering, evaporation deposition, electroplating or non-electroplating underneath the first insulation layer 3170 and the second conductive pad structure 3160 in the first through hole 3115. Subsequently, the conductive material is patterned to form the third passive element 3184 and the second conductive portion 3182 that surrounds the third passive element 3184. One end of the third passive element 3184 is connected with the second conductive portion 3182. The third passive element 3184 and the second conductive portion 3182 are formed in the same processing step.

Figure 10E:
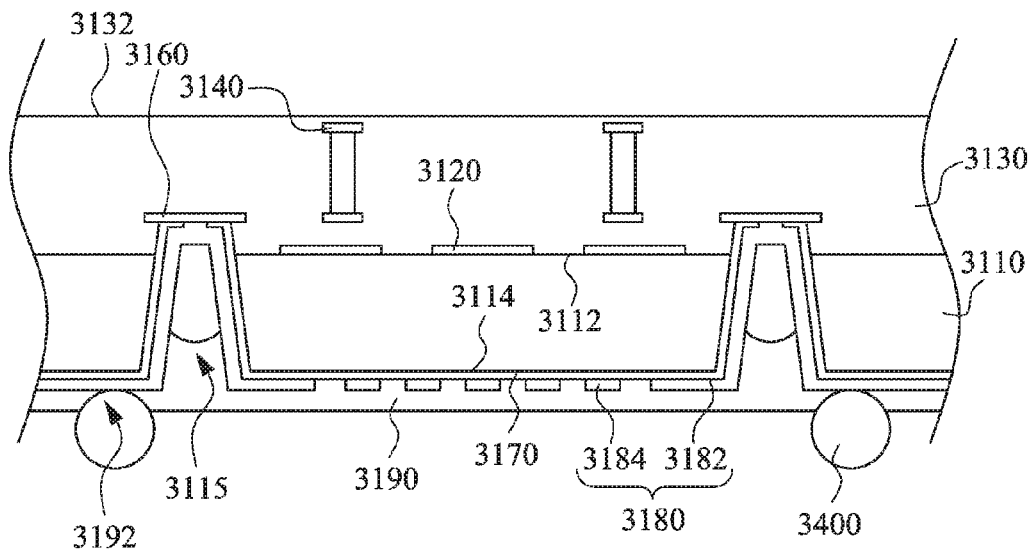

Next, step 950 is performed, and it is illustrated in FIG. 10E. In step 950, a first barrier layer 3190 is formed to cover the first conductive layer 3180. A second opening 3192 is formed in the first barrier layer 3190 to expose the first conductive portion 3182 of the first conductive layer 3180. A second external conductive connection 3400 is formed in the second opening 3192, such that the second external conductive connection 3400 is in contact with the first conductive portion 3182. The first barrier layer 3190 may be formed by brushing epoxy resin related material on the first conductive layer 3180. Subsequently, the first barrier layer 3190 is patterned to form a second opening 3192 such that a portion of the second conductive portion 3182 that is in the second opening 3192 of the first barrier layer 3190 is exposed. Subsequently, a second conductive connection 3400 is formed in the second opening 3192 and in contact with the first conductive portion 3182.

Figure 10F:
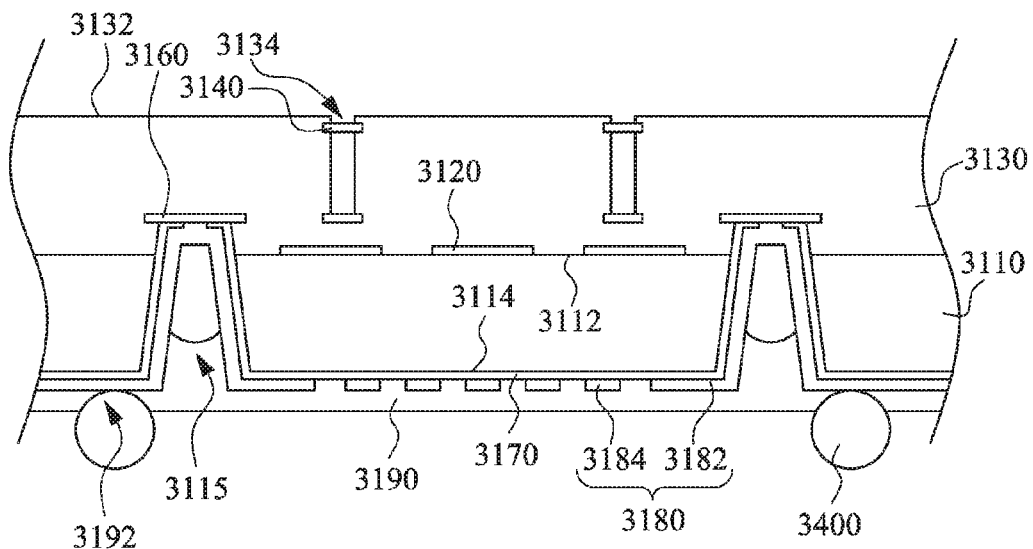

Next, step 960 is performed, and it is illustrated in FIG. 10F. In step 960, a first opening 3134 is formed in the first protection layer 3130 to expose the first conductive pad structure 3140. The first opening 3134 may be formed by, for example, photolithography etching, and the instant disclosure is not limited thereto.

Figure 10G:
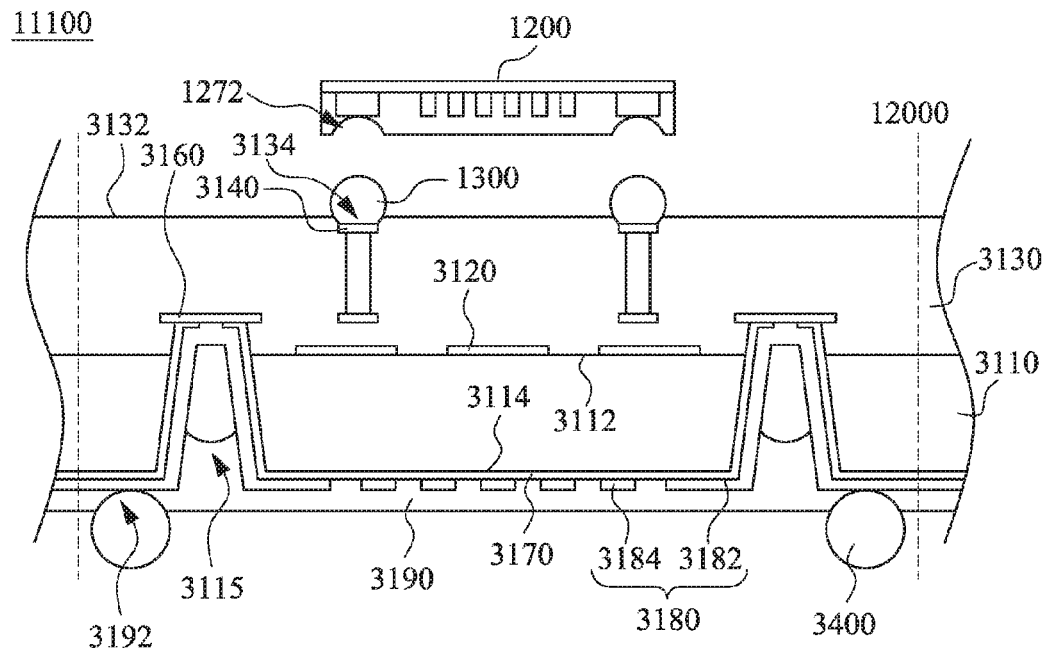
Figure 10H:
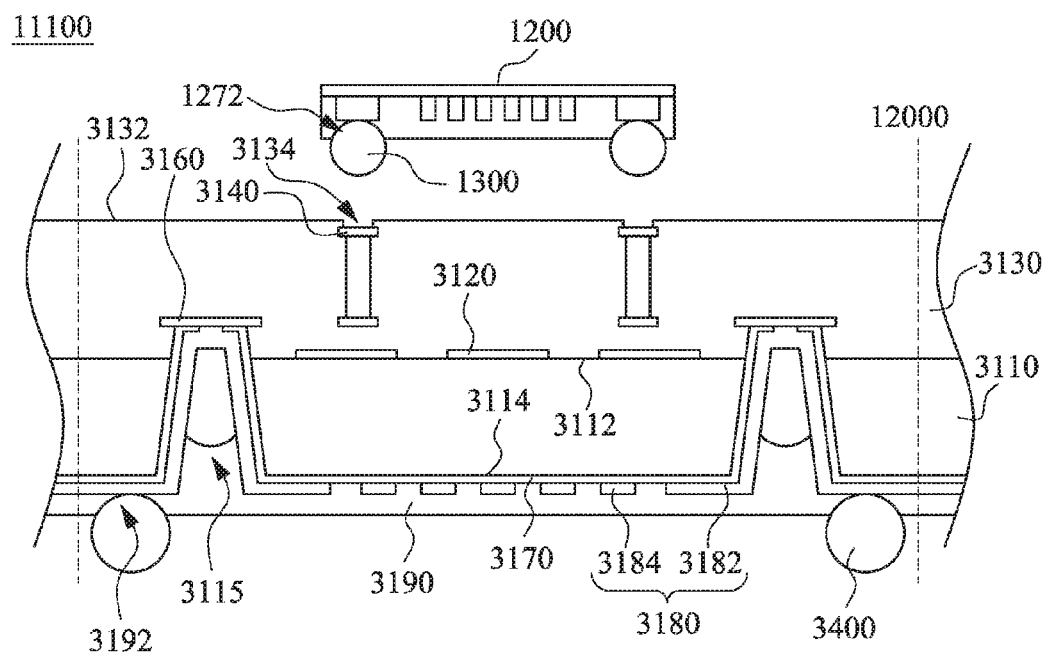

Next, step 970 is performed, and it is illustrated in FIG. 10G. In step 970, a first external conductive connection 1300 is formed in the first opening 3134. Consequently, the first external conductive connection 1300 can be in contact with the first conductive pad structure 3140 in the first opening 3134.

Next, step 980 is performed, and it is illustrated in FIG. 10G. In step 980, a second chip 1200 is connected to the third surface 3132 of the first wafer 11100 such that the active element 1220 is electrically connected to the first conductive pad structure 3140. The first external conductive connection 1300 is formed in the first opening 3134 in the previous step as shown in FIG. 10G. As a result, the second chip 1200, which is shown in FIG. 6E and does not have the first external conductive connection 1300 may be used. Subsequently, the first external conductive connection 1300 is connected to the second conductive portion 1262, such that a portion of the first external conductive connection 1300 is positioned in the third opening 1272.

Finally, step 990 is performed, and it is illustrated in FIG. 10G. In step 990, the first wafer 11100 is cut along a first scribe line 12000 to form a chip package 3000. After the first wafer 11100 and the second chip 1200 are combined, the first wafer 11100 is cut along the first scribe line 12000 to form the chip package 3000 as shown in FIG. 1.

In some embodiments of the instant disclosure, after step 960, step 980 is performed. Please refer to FIG. 10H. After step 960, step 980 is conducted. The second chip 1200 is connected to the third surface 1132 of the first wafer 8100 such that the active element 1220 is electrically connected to the first conductive pad structure 1140. In FIG. 10F, due to the absence of the first external conductive connection 1300 in the first opening 3134, the second chip 1200 having the first external conductive portion 1300 as shown in FIG. 6F may be used. Subsequently, the first external conductive connection 1300 and the first conductive pad structure 3140 are connected such that a portion of the first external conductive connection 1300 is positioned in the first opening 3134.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
   a first chip, comprising:
      a first substrate having a first surface and a second surface opposite to the first surface,
      a first passive element disposed on the first surface;
      a first protection layer covering the first passive element, the first protection layer having a third surface opposite to the first surface;
      a first conductive pad structure and a second conductive pad structure disposed in the first protection layer and electrically connected to the first passive element; and
      a first external conductive connection; and
   a second chip, comprising:
      a second substrate, wherein an active element is disposed underneath the second substrate;
      a second protection layer disposed underneath the second substrate and covering the active element;
      a third conductive pad structure disposed in the second protection layer and electrically connected to the active element, wherein the second protection layer is formed with a plurality of second through holes to expose the third conductive pad structure, and the first external conductive connection disposed in between the first conductive pad structure and the third conductive pad structure;
      a second insulation layer disposed underneath the second protection layer and extending to the second through hole to cover a wall of the second through hole; and
      a second conductive layer, comprising:
         a second conductive portion disposed underneath the second insulation layer, and a portion of the second conductive portion disposed in and filled up the second through hole and directly electrically connected with the third conductive pad structure and the first external conductive connection; and a plurality of second passive elements disposed underneath the second insulation layer and between the second through holes, and the second passive elements and the second conductive portion are electrically connected, wherein the second passive elements are electrically connected to the active element.

2. The chip package of claim 1, wherein the second conductive layer further comprises a second barrier layer covering the second conductive layer, the second barrier layer formed with a third opening exposing the second conductive portion.

3. The chip package of claim 2, wherein the first chip further comprises:

a first opening formed on the third surface of the first protection layer and exposing the first conductive pad structure; and a second opening formed on the third surface of the first protection layer and exposing the second conductive pad structure.

4. The chip package of claim 2, wherein the first chip further comprises:

a first opening formed on the third surface of the first protection layer and exposing the first conductive pad structure; and a first through hole extending from the second surface towards the third surface and exposing the second conductive pad structure.

5. The chip package of claim 3, further comprising:

a second external conductive connection disposed in the second opening and in contact with the second conductive pad structure, wherein the dimension of the second external conductive connection is larger than the first external conductive connection, and a portion of the first external conductive connection is disposed in the first opening, and a portion of the first external conductive connection is disposed in the third opening.

6. The chip package of claim 4, wherein the first chip further comprises:

a first insulating layer disposed underneath the second surface and extending to the first through hole and covering the wall of the first through hole;

a first conductive layer, comprising:

a first conductive portion disposed underneath the first insulation layer, and a portion of the first conductive portion disposed in the first through hole and in contact with the second conductive pad structure; and a third passive element disposed underneath the first insulation layer, and a portion of the third passive element being connected to the first conductive portion; and a first barrier layer covering the first conductive layer, and the first barrier layer formed with a second opening exposing the first conductive portion.

7. The chip package of claim 6, wherein the third passive element has a shape resembling "U", planar spiral and stereoscopic spiral.

8. The chip package of claim 6, further comprising a second external conductive connection disposed in the second opening and in contact with the first conductive portion, wherein a portion of the first external conductive connection is disposed in the first opening, and a portion of the first external conductive connection is disposed in the third opening.

9. A method of manufacturing a chip package, comprising:

providing a first wafer, the first wafer including:

a first substrate having a first surface and a second surface opposite to the first surface, a first passive element disposed on the first surface;

a first protection layer covering the first passive element, the first protection layer has a third surface opposite to the first surface; and a first conductive pad structure and a second conductive pad structure disposed in the first protection layer and electrically connected to the first passive element;

forming a first opening in the first protection layer to expose the first conductive pad structure;

forming a second chip comprising:

providing a second wafer, the second wafer including:

a second substrate;

an active element disposed underneath the second substrate;

a second protection layer disposed underneath the second substrate and covering the active element; and a third conductive pad structure disposed in the second protection layer and electrically connected to the active element;

forming a plurality of second through holes in the second protection layer to expose the third conductive pad structure;

forming a second insulating layer underneath the second protection layer and extending to the second through hole to cover a wall of the second through hole;

forming a second conductive layer underneath the second insulating layer and the third conductive pad structure, wherein the second conductive layer including:

a second conductive portion disposed in and filled up the second through hole; and a plurality of second passive elements, wherein the second passive elements disposed in between the second through holes, and the second passive elements and the second conductive portion being connected; and forming a second barrier layer covering the second conductive layer; and forming a third opening in the second barrier layer to expose the second conductive portion;

forming a first external conductive connection, wherein the second conductive portion directly electrically connected with the third conductive pad structure and the first external conductive connection; and connecting the second chip to the third surface of the first wafer such that the active element being electrically connected to the first conductive pad structure.

10. The method of claim 9, wherein forming the second chip further comprises:

forming a second barrier layer covering the second conductive layer;

forming a third opening in the second barrier layer to expose the second conductive portion, wherein the first external conductive connection is in the third opening; and cutting the second substrate, the second protection layer and the second barrier layer along a second scribe line to form the second chip.

11. The method of claim 9, further comprising:
forming a third chip, the third chip having an active element and a fourth passive element electrically connected to the active element; and
connecting the third chip to the third surface of the first wafer such that the active element being electrically connected to the first conductive pad structure.

12. The method of claim 10, further comprising:
forming a second opening in the first protection layer to expose the second conductive pad structure, wherein the first opening and the second opening are formed in the same step; and
forming a second external conductive connection in the second opening and in contact with the second conductive pad structure.

13. The method of claim 10, further comprising:
forming a first through hole extending from the second surface towards the third surface to expose the second conductive pad structure;
forming a first insulation layer underneath the second surface and extending to the first through hole and covering the wall of the first through hole; and
forming a first conductive layer underneath the first insulation layer and second conductive pad structure, the first conductive layer including a first conductive portion and a third passive element, the third passive element being connected to the first conductive portion.

14. The method of claim 12, further comprising:
connecting the first external conductive connection and the first conductive pad structure such that the first external conductive pad connection being in the first opening; and
cutting the first wafer along a first scribe line to form a chip package.

15. The method of claim 12, further comprising:
forming a first external conductive connection in the first opening and in contact with the first conductive pad structure;
connecting the first external conductive connection and the second conductive portion such that the first external conductive connection being in the third opening; and
cutting the first wafer along a first scribe line to form a chip package.

16. The method of claim 13, further comprising:
forming a first barrier layer to cover the first conductive layer;
forming a second opening in the first barrier layer to expose the first conductive portion; and
forming a second external conductive connection in the second opening and in contact with the first conductive portion.

17. The method of claim 16, further comprising:
connecting the first external conductive connection and the first conductive pad structure such that the first external conductive connection being in the first opening; and
cutting the first wafer along a first scribe line to form a chip package.

18. The method of claim 16, further comprising:
forming a first external conductive connection in the first opening and in contact with the first conductive pad structure;
connecting the first external conductive connection and the second conductive portion such that the first external conductive connection being in the third opening; and
cutting the first wafer along a first scribe line to form a chip package.

* * * * *